United States Patent
Nam (10) Patent No.: US 8,559,230 B2
(45) Date of Patent: Oct. 15, 2013

(54) ROW DECODER AND NON-VOLATILE MEMORY DEVICE

(75) Inventor: Ki-bum Nam, Suwon-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 155 days.

(21) Appl. No.: 13/325,219

(22) Filed: Dec. 14, 2011

(65) Prior Publication Data

US 2012/0314505 A1    Dec. 13, 2012

(30) Foreign Application Priority Data

Feb. 1, 2011    (KR) .......................... 10-2011-0010305

(51) Int. Cl.
   *G11C 11/34*     (2006.01)
   *G11C 16/06*     (2006.01)
   *H01L 29/94*     (2006.01)

(52) U.S. Cl.
   USPC ...... 365/185.23; 257/315; 257/316; 257/369; 257/371

(58) Field of Classification Search
   USPC ............. 365/185.23; 257/315, 316, 369, 371
   See application file for complete search history.

(56) References Cited

U.S. PATENT DOCUMENTS

| | | | |
|---|---|---|---|
| 5,770,963 A | 6/1998 | Akaogi et al. | |
| 2004/0080358 A1* | 4/2004 | Kushnarenko | 327/530 |
| 2010/0149901 A1* | 6/2010 | Chan | 365/230.06 |
| 2012/0113740 A1* | 5/2012 | Lee | 365/230.06 |

FOREIGN PATENT DOCUMENTS

| | | |
|---|---|---|
| JP | 06-168597 | 6/1994 |
| KR | 10-2002-0036275 A | 5/2002 |
| KR | 10-2007-0021758 A | 2/2007 |

\* cited by examiner

*Primary Examiner* — Ly D Pham
(74) *Attorney, Agent, or Firm* — Muir Patent Consulting, PLLC (57) ABSTRACT

A non-volatile memory device and a row decoder, the non-volatile memory device including: a memory cell array comprising a plurality of memory cells and each memory cell includes a first cell transistor and a second cell transistor; and a row decoder comprising a first driver and a second driver for generating first and second control signals. The first cell transistor is connected to the row decoder to receive the first control signal and the second cell transistor is connected to the row decoder to receive the second control signal. The first driver includes a first NMOS transistor and a first PMOS transistor formed adjacent to the first NMOS transistor. The second driver includes a second NMOS transistor and a second PMOS transistor formed adjacent to the second NMOS transistor. The first and second NMOS transistors are disposed between the first PMOS transistor and the second PMOS transistor.

19 Claims, 10 Drawing Sheets

| MODE | | EN_11 | VPPXS | VPX[k] | PPWX | WL[k] |
|---|---|---|---|---|---|---|
| ERASE | | L | 5 | 5 | 0 | 5 |
| PGM | | H | VDD | VDD | −5.2 | −5.2 |
| READ | SEL | L | 2.2 | 2.2 | 0 | 2.2 |
| | NSEL | H | 2.2 | 0 | 0 | 0 |

| MODE | | EN_21 | VPPX | VNX[k] | VPXCL[k] | SL[k] |
|---|---|---|---|---|---|---|
| ERASE | SEL | H | 5 | −6 | 5 | −6 |
| | NSEL | L | 5 | 5 | 5 | 5 |
| PGM | SEL | L | 10.7 | 0 | 10.7 | 10.7 |
| | NSEL | H | 10.7 | 0 | 0 | 0 |
| READ | | L | 2.2 | 0 | 2.2 | 2.2 |

FIG. 11

ROW DECODER AND NON-VOLATILE MEMORY DEVICE

CROSS-REFERENCE TO RELATED PATENT APPLICATION

This application claims the benefit of Korean Patent Application No. 10-2011-0010305, filed on Feb. 1, 2011, in the Korean Intellectual Property Office, the disclosure of which is incorporated herein in its entirety by reference.

BACKGROUND

Example embodiments relate to row decoders and non-volatile memory devices, and more particularly, to row decoders having minimized areas and non-volatile memory devices including the row decoders.

Non-volatile memory devices are used as storage media in memory systems due to their excellent data conservancy. Non-volatile memory devices have been spotlighted as highly integrated mass-storage devices that can replace given hard disks or floppy disks. Non-volatile memory devices are recently used as storage media in cellular phones, digital cameras, MP3 players, solid state drives (SSD), and the like.

SUMMARY

According to an example embodiment, there is provided a non-volatile memory device. The non-volatile memory device includes a memory cell array, a voltage generator, and a row decoder. The memory cell array includes a plurality of memory cells and each memory cell of the plurality of memory cells includes a first cell transistor and a second cell transistor. The voltage generator is configured to generate a plurality of voltages in response to an operation mode with respect to the plurality of memory cells. The row decoder includes a first driver and a second driver, and is configured to generate a first control signal and a second control signal, respectively. The first cell transistor is connected to the row decoder to receive the first control signal and the second cell transistor is connected to the row decoder to receive the second control signal. The first driver includes a first NMOS transistor and a first PMOS transistor formed adjacent to the first NMOS transistor. The second driver includes a second NMOS transistor and a second PMOS transistor formed adjacent to the second NMOS transistor. The first and second NMOS transistors are disposed between the first PMOS transistor and second PMOS transistor.

According to another example embodiment, a row decoder includes a first driver and a second driver. The first driver includes a first input terminal configured to receive a first voltage, the first driver is configured to generate a first control signal for controlling a first cell transistor of a memory cell. The second driver includes a second input terminal and a third input terminal configured to receive a second voltage and a third voltage, respectively. The second driver is configured to generate a second control signal for controlling a second cell transistor of the memory cell. Additionally, the first driver includes a first NMOS transistor and a first PMOS transistor and the second driver includes a second NMOS transistor and a second PMOS transistor. The first NMOS transistor is formed on a first P-well that is formed on a first N-well and the first PMOS transistor is formed on a second N-well disposed adjacent to the first N-well. The second PMOS transistor is formed on a third N-well separated from the first N-well and the second NMOS transistor is formed on a second P-well that is formed on the third N-well.

According to another embodiment, a semiconductor memory device includes a plurality of memory cells and a row decoder. The row decoder includes a first driver and a second driver. The first driver includes a first PMOS transistor and a first NMOS transistor and the second driver includes a second PMOS transistor and a second NMOS transistor. The first NMOS transistor is disposed adjacent to the first PMOS transistor and formed on a first N-well. The second NMOS transistor is disposed adjacent to the second PMOS transistor and formed on a second N-well different from the first N-well.

BRIEF DESCRIPTION OF THE DRAWINGS

Exemplary embodiments will be more clearly understood from the following detailed description taken in conjunction with the accompanying drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present embodiments.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1:
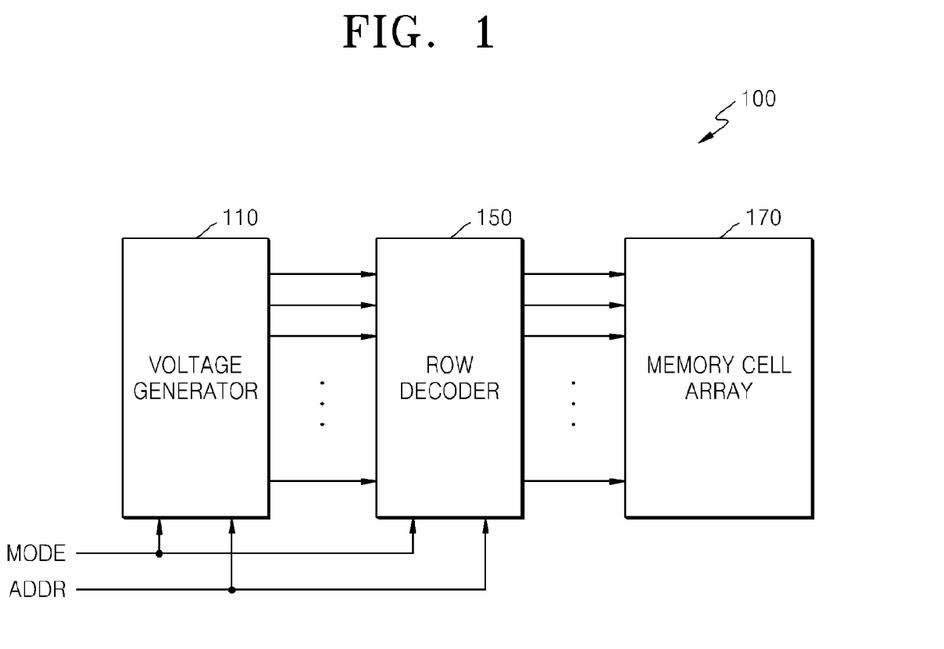
FIG. 1 is a block diagram of a non-volatile memory device according to example embodiments.

FIG. 1 is a block diagram of a non-volatile memory device 100 according to example embodiments.

Referring to FIG. 1, the non-volatile memory device 100 may include a voltage generator 110, a row decoder 150, and a memory cell array 170.

The voltage generator 110 may generate a plurality of voltages necessary for operating the non-volatile memory device 100. For example, the voltage generator 110 may generate the plurality of voltages corresponding to an operation mode and apply the generated voltages to the row decoder 150. The operation mode may be a read mode in which data stored in the memory cell array 170 is read, a program mode in which the data is programmed in the memory cell array 170, or an erasure mode in which the data stored in the memory cell array 170 is erased. The row decoder 150 generates control signals by using different voltages in the read mode, the program mode, and the erasure mode, and thus the voltage generator 110 may generate voltages having voltage levels necessary for the read mode, the program mode, and the erasure mode, and output the generated voltages to the row decoder 150.

The row decoder 150 may include a plurality of drivers that generate the control signals used to perform the operation mode by using at least one voltage corresponding to the voltages generated by the voltage generator 110, and output the generated control signals to at least one corresponding memory cell. For example, each of the drivers of the row decoder 150 may generate the control signal according to the operation mode and whether the at least one corresponding memory cell is selected.

The memory cell array 170 may include a plurality of memory cells capable of storing data. Each of the memory cells may include at least one transistor. If the memory cells include transistors, respectively, gates of the transistors may be connected to word lines, and the row decoder 150 may apply the control signals to the gates of the transistors through the word lines. If the memory cells are 2T cells each including two transistors, gates of selection transistors among the transistors may be connected to the word lines, and gates of storage transistors among the transistors may be connected to sense lines. In this case, the row decoder 150 may apply first control signals to the gates of the selection transistors through the word lines, and apply second control signals to the gates of the storage transistors through the sense lines. The storage transistors may include floating gates or charge accumulation insulators capable of storing data between the gates and bulk areas. The memory cells each including two transistors will be in more detail described with reference to FIGS. 2 and 3.

The non-volatile memory device 100 may be a flash memory device. For example, the non-volatile memory device 100 may be an NOR flash memory device. However, other types of memory devices (e.g., NAND flash, PRAM, MRAM etc.) may also be used.

According to one embodiment, at least one voltage according to the operation mode may be directly applied to each of the drivers of the row decoder 150 from the voltage generator 110. That is, according to the example embodiments, the voltages generated by the voltage generator 110 may be directly transferred to the corresponding drivers without global lines. For example, an output terminal of the voltage generator 110 and an input terminal of the corresponding driver of the row decoder 150 may be directly connected to each other through a local line. Alternatively, the output terminal of the voltage generator 110 and an input terminal of the row decoder 150 may be connected to each other through a global line, and the output terminal of the voltage generator 110 and an input terminal of the driver corresponding to the input terminal of the row decoder 150 may be directly connected to each other through the local line.

Therefore, according to the example embodiments, the row decoder 150 does not need the global line therein, thereby minimizing wires compared to the conventional art and reducing an area of the non-volatile memory device 100. Conventionally, a row decoder that is connected to even row memory cells is disposed on one side of a memory cell array, and a row decoder that is connected to odd row memory cells is disposed on another side of the memory cell array. However, according to the example embodiments, wires are minimized, and thus the row decoder 150 may be disposed on only one side of the memory cell array 170 while the non-volatile memory device 100 normally operates. The construction of the row decoder 150 will be described in more detail with reference to FIG. 4.

Figure 2:
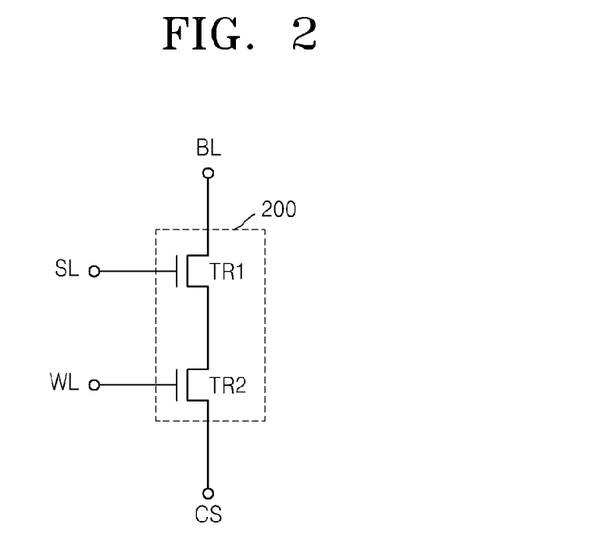
FIG. 2 is a circuit diagram of a memory cell of a memory cell array of FIG. 1 according to one embodiment.

FIG. 2 is a circuit diagram of a memory cell 200 of the memory cell array 170 of FIG. 1 according to an exemplary embodiment.

Referring to FIGS. 1 and 2, the memory cell 200 of the memory cell array 170 may include a storage transistor TR1 and a selection transistor TR2 as described with reference to FIG. 1. A sense line SL may be connected to a gate of the storage transistor TR1, a bit line BL may be connected to a first terminal thereof, and a first terminal of the selection transistor TR2 may be connected to a second terminal thereof. A word line WL may be connected to a gate of the selection transistor TR2, the second terminal of the storage transistor TR1 may be connected to the first terminal of the selection transistor TR2, and a common source line CS may be connected to a second terminal of the selection transistor TR2.

Figure 3:
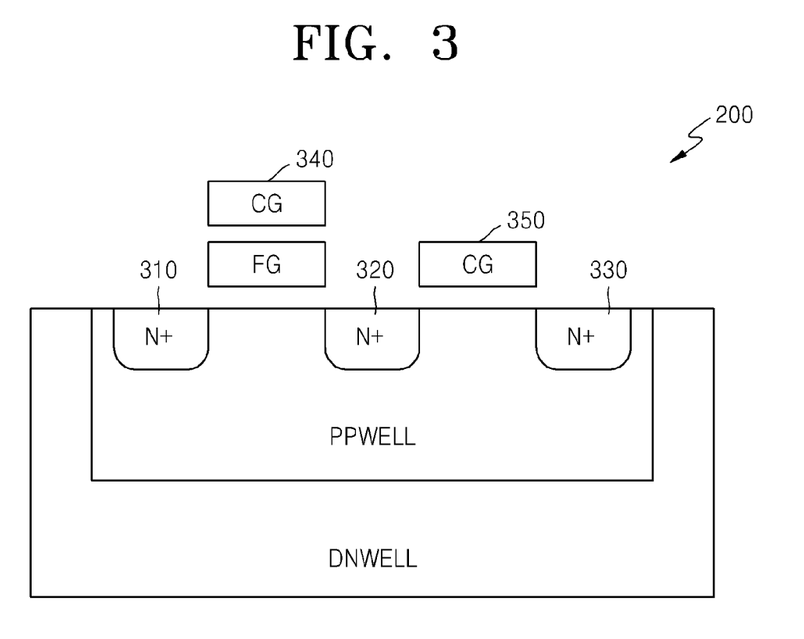
FIG. 3 is a cross-sectional view illustrating the memory cell of FIG. 2 according to one embodiment.

FIG. 3 is a cross-sectional view illustrating the memory cell 200 of FIG. 2 according to an exemplary embodiment.

Referring to FIGS. 1 through 3, the storage transistor TR1 and the selection transistor TR2 of the memory cell 200 may be formed in a P-well PPWELL that is formed in a deep N-well DNWELL. N+ regions 310, 320, and 330 may be formed in the P-well PPWELL. The N+ region 310 may be the bit line BL of FIG. 2. The N+ region 330 may be the common source region CS of FIG. 2. A floating gate electrode FG insulated by a thin insulation film is formed in a top portion of a channel region between the N+ region 310 and the N+ region 320. A control gate electrode 340 insulated by an insulation film is formed in a top portion of the floating gate electrode FG. The control gate electrode 340 may be the sense line SL of FIG. 2. A control gate electrode 350 insulated by a thin insulation film is formed in a top portion of a channel region between the N+ region 320 and the N+ region 330. The control gate electrode 350 may be the word line WL of FIG. 2.

Figure 4:
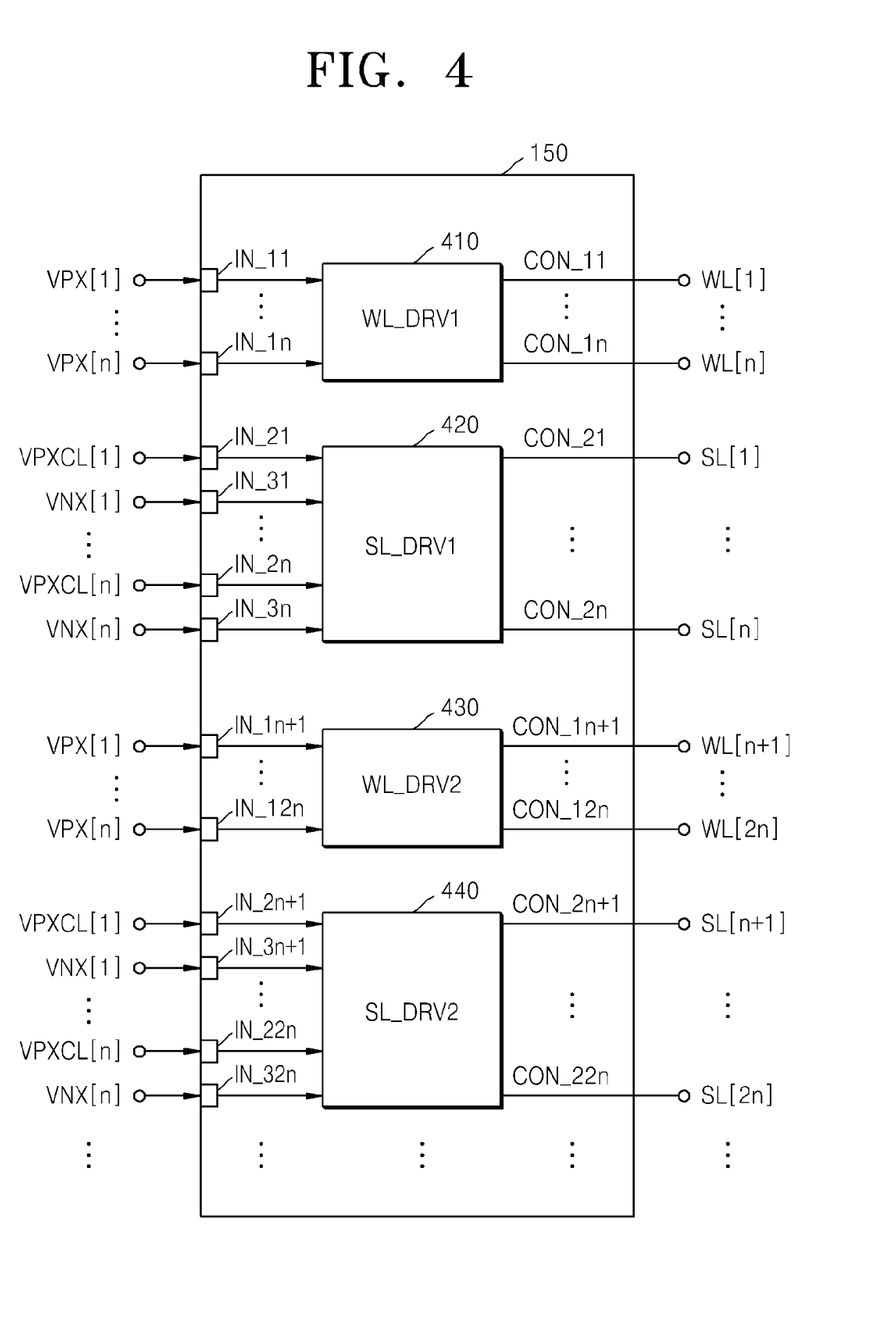
FIG. 4 is a circuit diagram of a row decoder of FIG. 1 according to an example embodiment.

FIG. 4 is a circuit diagram of the row decoder 150 of FIG. 1 according to an embodiment.

Referring to FIGS. 1 through 4, the row decoder 150 may include a plurality of drivers 410, 420, 430, 440, ... and a plurality of input terminals IN_11, ..., IN_32N, .... The input terminals IN_11, ..., IN_32n, ... are applied to the corresponding voltages generated by the voltage generator 110. The input terminals IN_11, ..., IN_32N, ... are directly connected to the corresponding drivers of the drivers 410, 420, 430, 440, .... For example, the driver 410 is directly connected to the input terminal IN_11, and a first voltage VPX[1] is applied to the driver 410 through the input terminal IN_11. The driver 430 is directly connected to the input terminal IN_1n+1, and the first voltage VPX[1] is applied to the driver 430 through the input terminal IN_1n+1. The driver 420 is directly connected to the input terminal IN_21, and a second voltage VPXCL[1] is applied to the driver 420 through the input terminal IN_21. The driver 440 is directly connected to the input terminal IN_2n+1, and the second voltage VPXCL[1] is applied to the driver 440 through the input terminal IN_2n+1. The driver 420 is directly connected to the input terminal IN_31, and a third voltage VNX[1] is applied to the driver 420 through the input terminal IN_31. The driver 440 is directly connected to the input terminal IN_3n+1, and the third voltage VNX[1] is applied to the driver 440 through the input terminal IN_3n+1. That is, according to one embodiment, the voltages applied through the input terminals IN_11, ..., IN_32n, ... may not be applied to the corresponding drivers through global lines but may be directly applied to corresponding word line drivers from the input terminals IN_11, ..., IN_32n, .... For example, the input terminals IN_11, ..., IN_32n, ... and the drivers 410, 420, 430, 440, ... corresponding to the input terminals IN_11, ..., IN_32n, respectively, may be directly connected to each other through local lines.

In one embodiment, the memory cell array 170 includes the memory cell 200 of FIGS. 2 and 3, the drivers 410 and 430 may be word line drivers that apply the corresponding first control signals CON_11, ..., CON_12n to the corresponding word lines WL[1], ... WL[2n], and the drivers 420 and 440 may be sense line drivers that apply the corresponding second control signals CON_21, ..., CON_22n to corresponding sense lines SL[1], ... SL[2n].

The construction and operation of the word line drivers will now be described with reference to FIGS. 5 through 7, and the construction and operation of the sense line drivers will now be described with reference to FIGS. 8 through 10.

Figure 5:
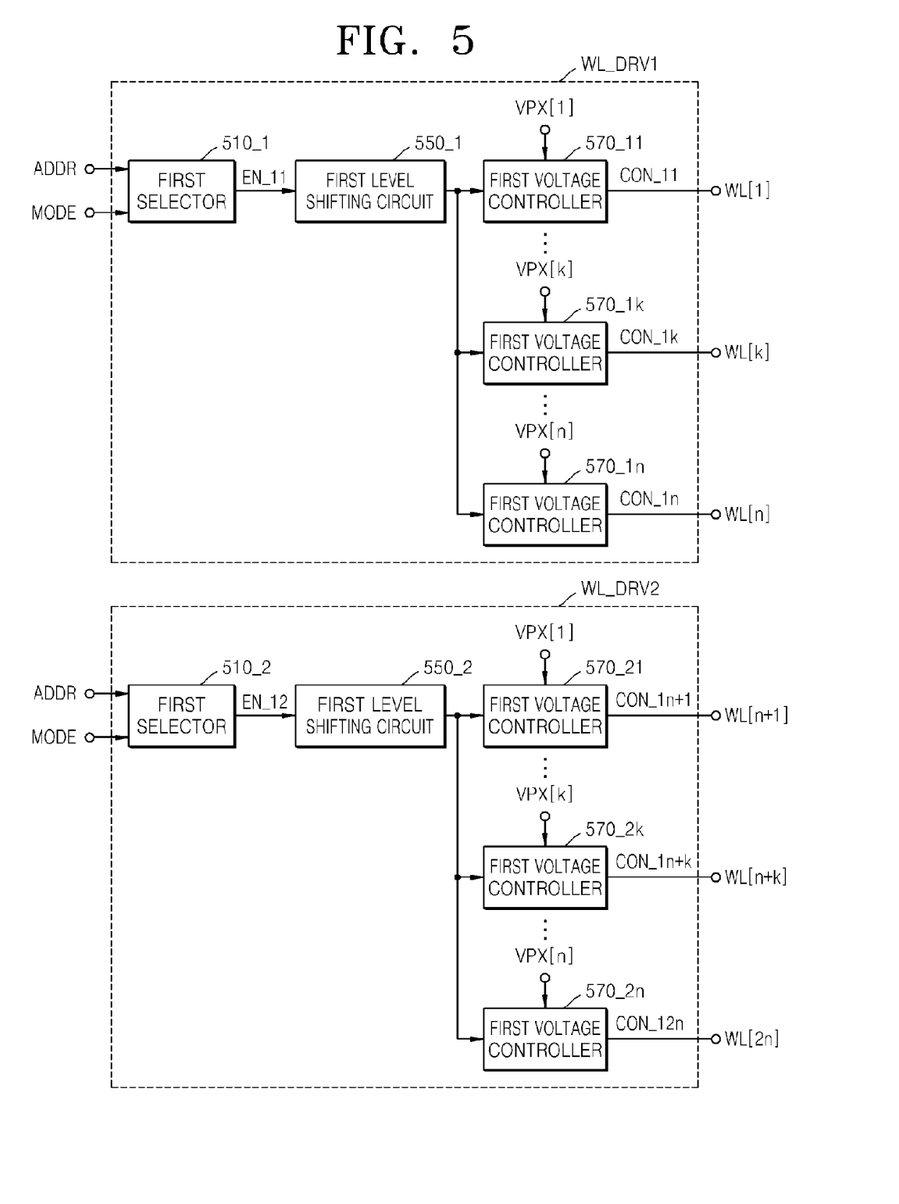
FIG. 5 is a block diagram of word line drivers of FIG. 4 according to an example embodiment.

FIG. 5 is a block circuit diagram of word line drivers WL_DRV1 and WL_DRV2 of FIG. 4 according to an embodiment.

Referring to FIGS. 1 through 5, at least one first voltage VPX[1], ..., VPX[n] (n is a natural number) corresponding to the voltages generated by the voltage generator 110 may be directly applied to each of the word line drivers WL_DRV1 and WL_DRV2 from the voltage generator 110. Each of the word line drivers WL_DRV1 and WL_DRV2 may generate the first control signals CON_11, ..., CON_12n and transfer the generated first control signals CON_11, ..., CON_12n to the corresponding word lines WL[1], ..., WL[2n], by using the corresponding at least one first voltage VPX[1], ..., VPX[n], a corresponding address ADDR, and a mode signal MODE corresponding to the operation mode.

The word line driver WL_DRV1 may include a first selector 510_1, a first level shifting circuit 550_1, and at least one first voltage controller 570_11, ..., 570_1k, ..., 570_1n.

The first selector 510_1 may generate a first enable signal EN_11 in response to the mode signal MODE and the corresponding address ADDR. For example, the first selector 510_1 may generate the first enable signal EN_11 of a logic low status during the erasure mode, and may generate the first enable signal EN_11 of a logic high status during the program mode. In the read mode, the first selector 510_1 may generate the first enable signal EN_11 of the logic low status when a corresponding memory cell is selected in response to the address ADDR, and may generate the first enable signal EN_11 of the logic high status when the corresponding memory cell is not selected in response to the address ADDR. However, the first selector 510_1 of the present embodiment is not limited thereto, and may generate the first enable signal EN_11 of a different logic status according to the construction of the first level shifting circuit 550_1 and the at least one first voltage controller 570_11, ..., 570_1n that will be described below.

The first level shifting circuit 550_1 may perform a latch operation and a level shifting operation in response to the first enable signal EN_11. The first level shifting circuit 550_1 will now be described in more detail with reference to FIG. 6.

The at least one first voltage controller 570_11, ..., 570_1k, ..., 570_1n (k is a natural number greater than 1 and smaller than n) may generate an output signal of the first level shifting circuit 550_1 and the first control signals CON_11, ..., CON_12n by using the corresponding at least one first voltage VPX[1], ..., VPX[k], ..., VPX[n], and may transfer the generated first control signals CON_11, ..., CON_12n to corresponding word lines. The at least one first voltage controller 570_11, ..., 570_1k, ..., 570_1n will be described in more detail with reference to FIG. 6.

The word line driver WL_DRV2 may include a first selector 510_2, a first level shifting circuit 550_2, and at least one first voltage controller 570_21, ..., 570_2k, ..., 570_1n. The first selector 510_2, the first level shifting circuit 550_2, and the at least one first voltage controller 570_21, ..., 570_2k, ..., 570_1n are similar to the first selector 510_1, the first level shifting circuit 550_1, and the at least one first voltage controller 570_11, ..., 570_1k, ..., 570_1n described above, and thus detailed descriptions thereof will not be repeated here.

Figure 6:
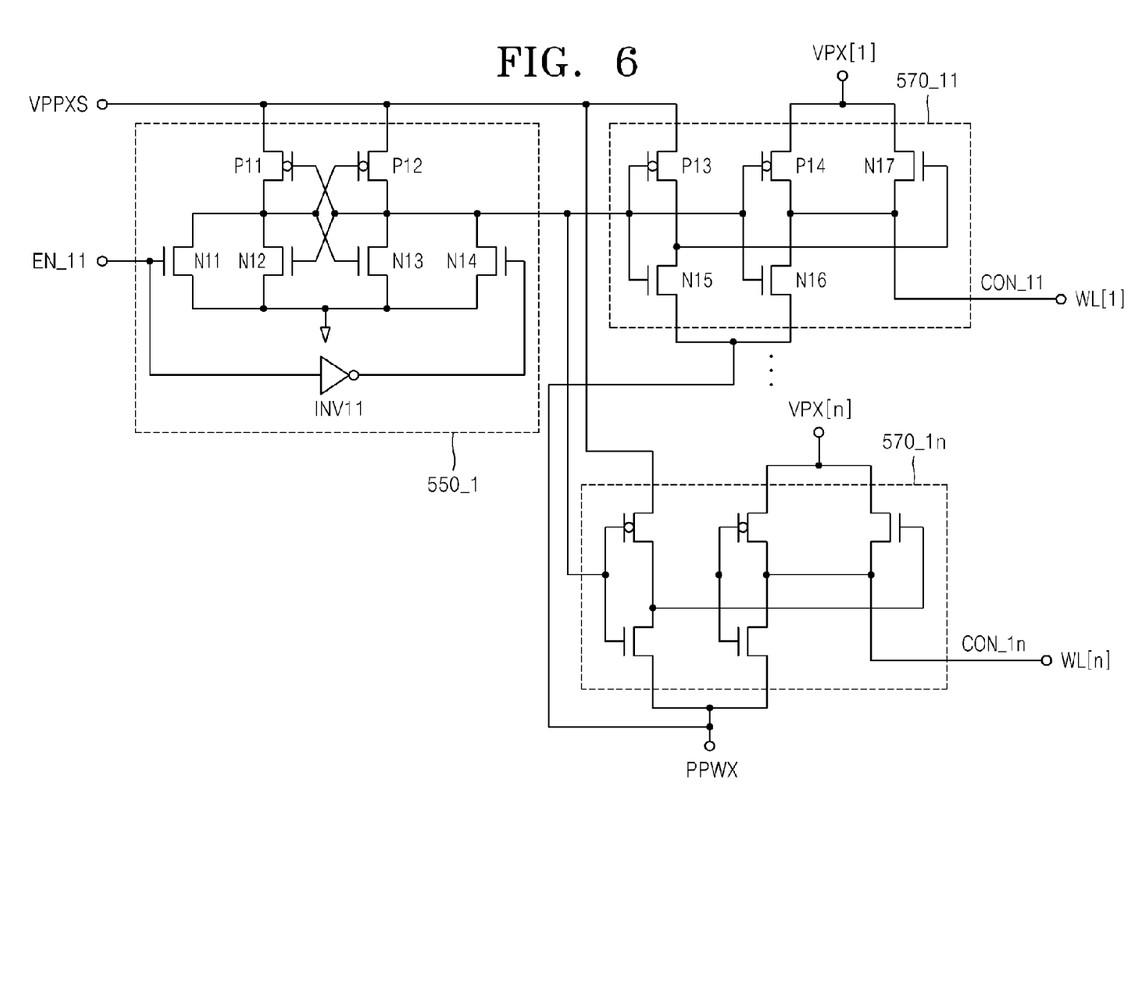
FIG. 6 is a circuit diagram of a first level shifting circuit and at least one first voltage controller of FIG. 5 according to an example embodiment.

FIG. 6 is a circuit diagram of the first level shifting circuit 550_1, and the at least one first voltage controller 570_11, ..., 570_1k, ..., 570_1n of FIG. 5 according to one embodiment.

Referring to FIGS. 1 through 6, the first level shifting circuit 550_1 may include a plurality of PMOS transistors P11 and P12, a plurality of NMOS transistors N11, N12, N13, and N14, and an inverter INV11. A voltage VPPXS is applied to a first terminal of the PMOS transistor P11, a first terminal of the NMOS transistor N12, a gate of the PMOS transistor P12, and a gate of the NMOS transistor N13 are connected to a second terminal of the PMOS transistor P11, and a gate of the NMOS transistor N12 is connected to a gate of the PMOS transistor P11. The voltage VPPXS is applied to a first terminal of the PMOS transistor P12, a first terminal of the NMOS transistor N13, the gate of the PMOS transistor P11, and the gate of the NMOS transistor N12 are connected to a second terminal of the PMOS transistor P12, and the gate of the NMOS transistor N13 is connected to a gate of the PMOS transistor P12. The first enable signal EN_11 is applied to a gate of the NMOS transistor N11, a second terminal of NMOS transistor N12 is connected to a second terminal of NMOS transistor N11, and the ground voltage is applied to the second terminal of the NMOS transistor N11. The second terminal of the PMOS transistor P11 is connected to the first terminal of the NMOS transistor N12, a ground voltage is applied to a second terminal of the NMOS transistor N12, and the gate of the PMOS transistor P11 is connected to the gate of the NMOS transistor N12. The second terminal of the PMOS transistor P12 is connected to the first terminal of the NMOS transistor N13, the ground voltage is applied to a second terminal of the NMOS transistor N13, and the gate of the PMOS transistor P12 is connected to the gate of the NMOS transistor N13. An inverted signal of the first enable signal EN_11 is applied to a gate of the NMOS transistor N14, the first terminal of the NMOS transistor N13 is connected to a first terminal of the NMOS transistor N14, and the ground voltage is applied to a second terminal of the NMOS transistor N14.

The first voltage controller 570_11 may include a plurality of PMOS transistors P13 and P14, and a plurality of NMOS transistors N15, N16, and N17. The voltage VPPXS is applied to a first terminal of the PMOS transistor P13, a first terminal of the NMOS transistor N15 and a gate of the NMOS transistor N17 are connected to a second terminal of the PMOS transistor P13, and a first terminal of the NMOS transistor N14 is connected to a gate of the PMOS transistor P13. A second terminal of the PMOS transistor P13 and a gate of the NMOS transistor N17 are connected to a first terminal of the NMOS transistor N15, a voltage PPWX is applied to a second terminal of the NMOS transistor N15, and the first terminal of the NMOS transistor N14 is connected to a gate of the NMOS transistor N15. The first voltage VPX[1] is applied to a first terminal of the PMOS transistor P14, a first terminal of the NMOS transistor N16 and a second terminal of the NMOS transistor N17 are connected to a second terminal of the PMOS transistor P14, and the first terminal of the NMOS transistor N14 is connected to a gate of the PMOS transistor P14. A second terminal of the PMOS transistor P14 and the second terminal of the NMOS transistor N17 are connected to a first terminal of the NMOS transistor N16, the voltage PPWX is applied to a second terminal of the NMOS transistor N16, and the first terminal of the NMOS transistor N14 is connected to a gate of the NMOS transistor N16. The first voltage VPX[1] is applied to a first terminal of the NMOS transistor N17, the second terminal of the PMOS transistor P14 and the corresponding word line WL[1] are connected to a second terminal of the NMOS transistor N17.

The constructions of the first voltage controllers 570_12, ..., 570_1k, ..., 570_1n are similar to that of the first voltage controller 570_11, and thus the descriptions of the other first voltage controllers are not repeated here. The operations of the first level shifting circuit 550_1 and the at least one first voltage controller 570_11, ..., 570_1k, ..., 570_1n will be described in more detail with reference to FIG. 7.

Figure 7:
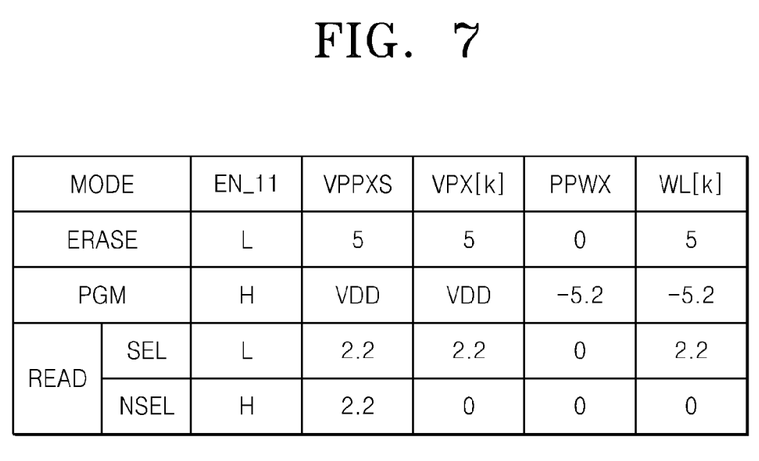
FIG. 7 is a table for describing the operation of a word line driver according to an example embodiment.

FIG. 7 is a table for describing the operation of a word line driver WL_DRV according to an exemplary embodiment.

Referring to FIGS. 1 through 7, in the erasure mode ERASE, the first selector 510_1 may generate the first enable signal EN_11 of a logic low status irrespective of whether a corresponding memory cell is selected. In this case, the NMOS transistor N11 is turned off, and the NMOS transistor N14, the PMOS transistor P11, and the NMOS transistor N13 is turned on, and thus the first level shifting circuit 550_1 outputs a signal of a ground voltage level. The first voltage controller 570_11 receives the signal of the ground voltage level from the first level shifting circuit 550_1, and thus the PMOS transistors P13 and P14 are turned on. The voltage VPPXS is applied to a gate of the NMOS transistor N17, and thus the NMOS transistor N17 is turned on. Therefore, the first voltage controller 570_11 may transfer the first control signal CON_11 of a first voltage VPX[1] level to the corresponding word line WL[1].

In the program mode PGM, the first selector 510_1 may generate the first enable signal EN_11 of a logic high status irrespective of whether a corresponding memory cell is selected. In this case, the NMOS transistor N11, the PMOS transistor P12, and the NMOS transistor N12 are turned on, and thus the first level shifting circuit 550_1 outputs a signal of a power voltage VDD level that is a voltage VPPXS level. For example, the power voltage VDD may include various voltage levels greater than 0 volts. The first voltage controller 570_11 receives the signal of the power voltage VDD level from the first level shifting circuit 550_1, and thus the NMOS transistors N15 and N16 are turned on. The voltage PPWX is applied to the gate of the NMOS transistor N17, and thus the NMOS transistor N17 is turned off. Therefore, the first voltage controller 570_11 may transfer the first control signal CON_11 of the voltage PPWX level to the corresponding word line WL[1].

As described above, when the first enable signal EN_11 is in a logic low status, the first voltage controller 570_11 may generate the first control signal CON_11 of the first voltage VPX[1] level, and when the first enable signal EN_11 is in a logic high status, the first voltage controller 570_11 may generate the first control signal CON_11 of the voltage PPWX level.

In the read mode READ, when the corresponding memory cell is selected, the first enable signal EN_11 is in the logic low status, and when the corresponding memory cell is not selected, the first enable signal EN_11 is in the logic high status. Therefore, when the corresponding memory cell is selected in the read mode READ, the first voltage controller 570_11 may generate the first control signal CON_11 of the first voltage VPX[1] level and output the first control signal CON_11 of the first voltage VPX[1] level to the corresponding word line WL[1], and when the corresponding memory cell is not selected in the read mode READ, the first voltage controller 570_11 may generate the first control signal CON_11 of the voltage PPWX level and output the first control signal CON_11 of the voltage PPWX level to the corresponding word line WL[1].

The operations of the first voltage controllers 570_12, . . . , 570_1k, . . . , 570_1n are similar to that of the first voltage controller 570_11, and thus the descriptions of the other first voltage controllers are not repeated here.

Figure 8:
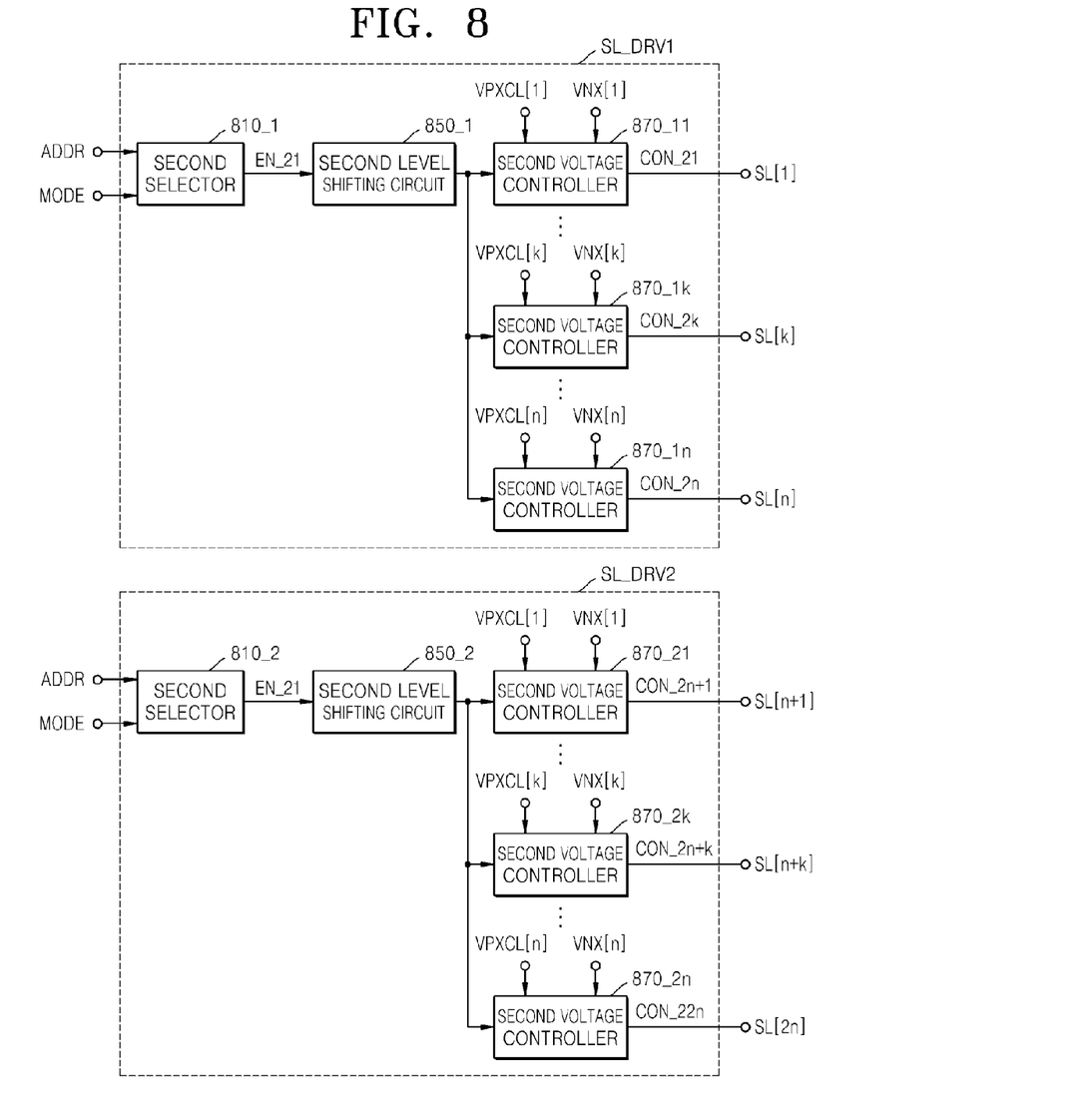
FIG. 8 is a block diagram of sense line drivers of FIG. 4 according to an example embodiment.

FIG. 8 is a block circuit diagram of the sense line drivers SL_DRV1 and SL_DRV2 of FIG. 4 according to an embodiment.

Referring to FIGS. 1 through 8, at least one second voltages VPXCL[1], . . . , VPXCL[n] and at least one third voltages VNX[1], . . . , VNX[n] corresponding to the voltages generated by the voltage generator 110 may be directly applied to each of the sense line drivers SL_DRV1 and SL_DRV2 from the voltage generator 110. Each of the sense line drivers SL_DRV1 and SL_DRV2 may generate the second control signals CON_21, . . . , CON_22n and transfer the generated second control signals CON_21, . . . , CON_22n to the corresponding sense lines SL[1], . . . , SL[2n] by using the corresponding at least one second voltage VPXCL[1], . . . , VPXCL[n], the corresponding address ADDR, and the mode signal MODE corresponding to the operation mode.

The sense line driver SL_DRV1 may include a second selector 810_1, a second level shifting circuit 850_1, and at least one second voltage controller 870_11, . . . , 870_1k, . . . , 870_1n.

The second selector 810_1 may generate a second enable signal EN_21 in response to the mode signal MODE and the corresponding address ADDR. For example, in the erasure mode, the second selector 810_1 may generate the second enable signal EN_21 of a logic high status when a corresponding memory cell is selected, and may generate the second enable signal EN_21 of a logic low status when the corresponding memory cell is not selected. In the program mode, the second selector 810_1 may generate the second enable signal EN_21 of the logic low status when the corresponding memory cell is selected, and may generate the second enable signal EN_21 of the logic high status when the corresponding memory cell is not selected. In the read mode, the second selector 810_1 may generate the second enable signal EN_21 of the logic low status. However, the second selector 810_1 of the present embodiment is not limited thereto, and may generate the second enable signal EN_21 of a different logic status according to the construction of the second level shifting circuit 850_1 and the at least one second voltage controller 870_11, . . . , 870_1k, . . . , 870_1n that will be described below.

The second level shifting circuit 850_1 may perform a latch operation and a level shifting operation in response to the second enable signal EN_21. The second level shifting circuit 850_1 will be described in more detail with reference to FIG. 9.

The at least one second voltage controller 870_11, . . . , 870_1k, . . . , 870_1n may generate the second control signals CON_21, . . . , CON_22n by using an output signal of the second level shifting circuit 850_1, the at least one second voltage VPXCL[1], . . . , VPXCL[n] and the at least one third voltage VNX[1], . . . , VNX[1], and may transfer the generated second control signals CON_21, . . . , CON_22n to corresponding sense lines. The at least one second voltage controller 870_11, . . . , 870_1k, . . . , 870_1n will be described in more detail with reference to FIG. 9.

The sense line driver SL_DRV2 may include a second selector 810_2, a second level shifting circuit 850_2, and at least one second voltage controller 870_21, . . . , 870_2k, . . . , 870_1n. The second selector 810_2, the second level shifting circuit 850_2, and the at least one second voltage controller 870_11, . . . , 870_1k, . . . , 870_1n are similar to the second selector 810_1, the second level shifting circuit 850_1, and the at least one second voltage controller 870_11, . . . , 870_1k, . . . , 870_1n described above, and thus detailed descriptions thereof will not be repeated here.

Figure 9:
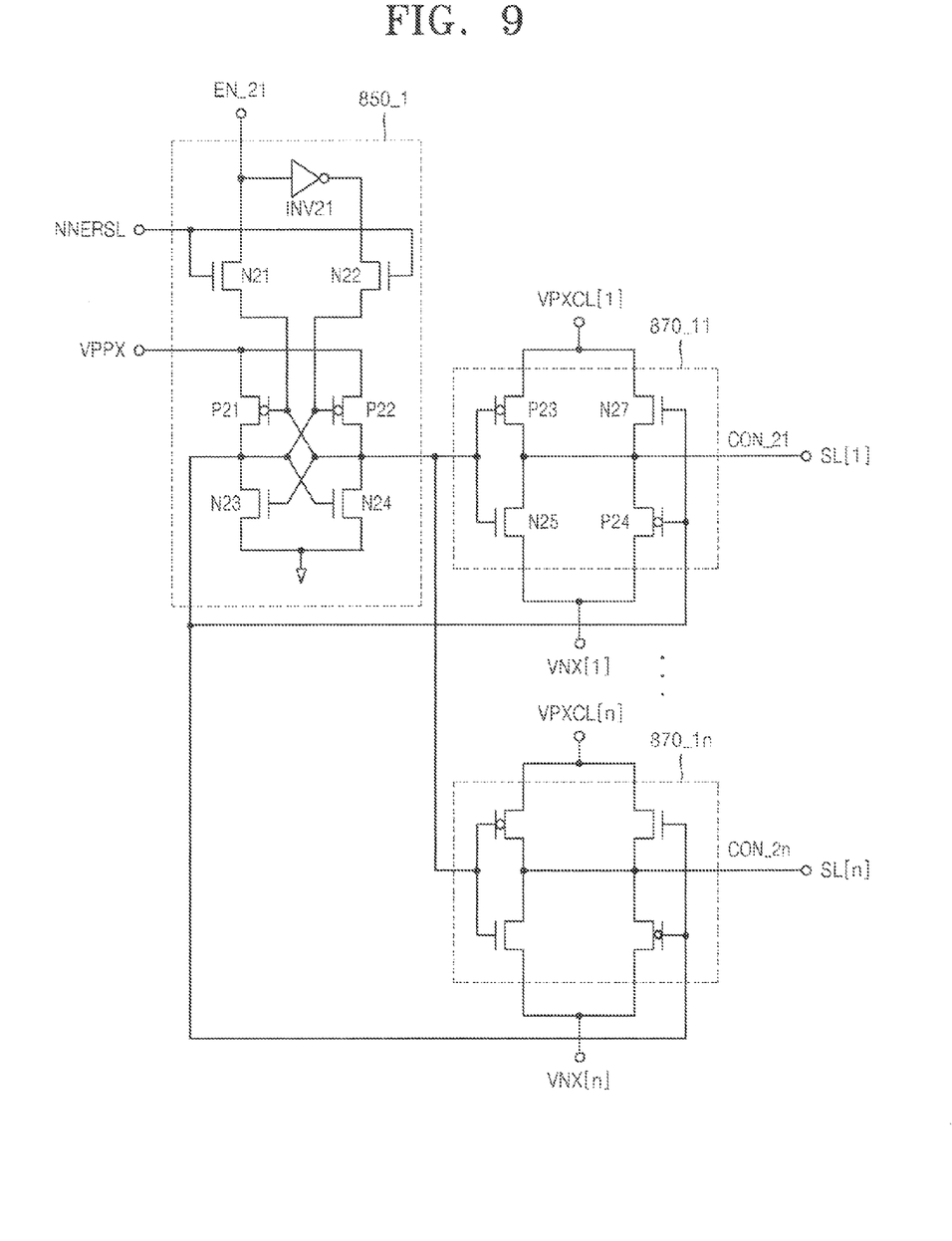
FIG. 9 is a circuit diagram of a second level shifting circuit and at least one second voltage controller of FIG. 8 according to an example embodiment.

FIG. 9 is a circuit diagram of the second level shifting circuit 850_1 and the at least one second voltage controller 870_11, . . . , 870_1n of FIG. 8 according to an embodiment.

Referring to FIGS. 1 through 4, 8, and 9, the second level shifting circuit 850_1 may include a plurality of PMOS transistors P21 and P22, a plurality of NMOS transistors N21, N22, N23, and N24, and an inverter INV21. A latch enable signal NNERSL is applied to a gate of the NMOS transistor N21, the second enable signal EN_21 is applied to a first terminal of the NMOS transistor N21, and a gate of the PMOS transistor P21 is connected to a second terminal of the NMOS transistor N21. The latch enable signal NNERSL is applied to a gate of the NMOS transistor N22, an inverted signal of the second enable signal EN_21 is applied to a first terminal of the NMOS transistor N22, and a gate of the PMOS transistor P22 is connected to a second terminal of the NMOS transistor N22. The voltage VPPX is applied to first terminals of the PMOS transistor P21 and P22. A first terminal of the NMOS transistor N23, the gate of the PMOS transistor P22, and gates of NMOS transistors N24 and N27 and the PMOS transistor P24 are connected to a second terminal of the PMOS transistor P21, and the second terminal of the NMOS transistor N21 and a gate of the NMOS transistor N23 are connected to a gate of the PMOS transistor P21. The voltage VPPX is applied to a first terminal of the PMOS transistor P22, a first terminal of the NMOS transistor N24, the gates of the PMOS transistors P21 and P23, and the gates of NMOS transistors N23 and N25 are connected to a second terminal of the PMOS transistor P22, and a gate of the NMOS transistor N24 is connected to a gate of the PMOS transistor P22. The second terminal of the PMOS transistor P21 is connected to the first terminal of the NMOS transistor N23, a ground voltage is applied to a second terminal of the NMOS transistor N23. The second terminal of the PMOS transistor P22 is connected to the first terminal of the NMOS transistor N24, the ground voltage is applied to a second terminal of the NMOS transistor N24.

The second voltage controller 870_11 may include the PMOS transistors P23 and P24 and the NMOS transistors N25 and N27. The second voltage VPXCL[1] is applied to a first terminal of the PMOS transistor P23 and a first terminal of the NMOS transistor N27. First terminals of the NMOS transistor N25 and the PMOS transistor P24 and a second terminal of the NMOS transistor N27 are connected to a second terminal of the PMOS transistor P23, and the first terminal of the NMOS transistor N24 is connected to a gate of the PMOS transistor P23. The third voltage VNX[1] is applied to second terminals of the NMOS transistor N25 and the PMOS transistor P24, and the first terminal of the NMOS transistor N24 is connected to the gate of the NMOS transistor N25. The second terminal of the PMOS transistor P23, the first terminal of the NMOS transistors N25, and the second terminal of the NMOS transistor N27 are connected to the first terminal of the PMOS transistor P24, and the first terminal of the NMOS transistor N23 is connected to the gate of the PMOS transistor P24. The second voltage VPXCL[1] is applied to a first terminal of the NMOS transistor N27, the first terminals of the NMOS transistors N25 and the PMOS transistor P24 and the second terminal of the PMOS transistor P23 are connected to the second terminal of the NMOS transistor N27, and the first terminal of the NMOS transistor N23 is connected to the gates of the NMOS transistor N27 and the PMOS transistor P24.

The constructions of the second voltage controllers 870_12, . . . , 870_1n are similar to that of the second voltage controller 870_11, and thus the descriptions of the other second voltage controllers are not repeated here. The operations of the second level shifting circuit 850_1 and the second voltage controllers 870_11, . . . , 870_1n will be described in more detail with reference to FIG. 10.

Figure 10:
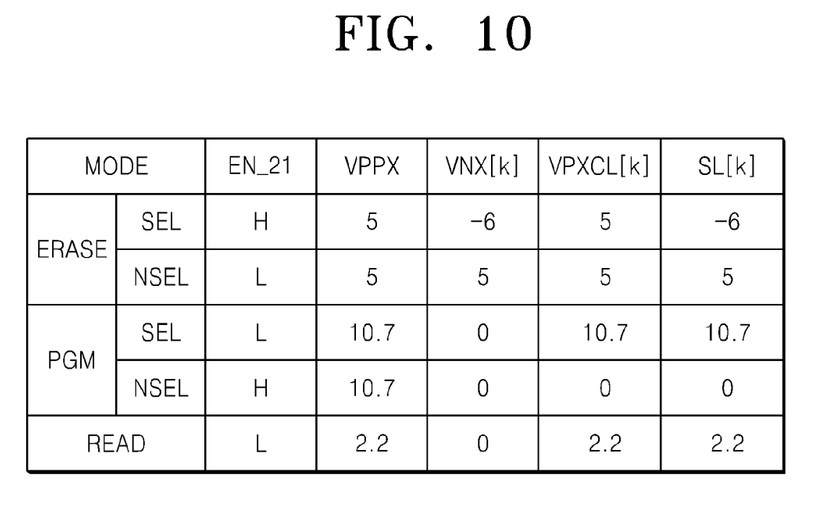
FIG. 10 is a table for describing the operation of a sense line driver according to an example embodiment.

FIG. 10 is a table for describing the operation of the sense line driver SL_DRV according to an embodiment.

Referring to FIGS. 1 through 4 and 8 through 10, when a corresponding memory cell is not selected in the program mode PGM, the second selector 810_1 may generate the second enable signal EN_21 of a logic high status. When a programming operation begins, the latch enable signal NNERSL maintains the logic high status so that the NMOS transistors N21 and N22 are turned on. When the second enable signal EN_21 having the logic high status is transferred through the NMOS transistor N21, and an inverted signal of the second enable signal EN_21 is transferred through the NMOS transistor N22, the latch enable signal NNERSL becomes a logic low status. If a voltage of the second enable signal EN_21 is changed to have a logic low status, the latch enable signal NNERSL becomes the logic high status again. When the second enable signal EN_21 having the logic high status and the inverted signal of the second enable signal EN_21 are transferred, the NMOS transistor N23 and the PMOS transistor P22 are turned on so that the voltage VPPX is applied to the gates of the PMOS transistor P23 and the NMOS transistor N25, and a ground voltage is applied to the gates of the NMOS transistors N26 and N27. Thus, the NMOS transistor N25 only is turned on so that the second voltage controller 870_11 may generate the second control signal CON_21 of a third voltage VNX[1] level and transfer the second control signal CON_21 of the third voltage VNX[1] level to the corresponding sense line SL[1].

When the corresponding memory cell is selected in the program mode PGM, the second selector 810_1 may generate the second enable signal EN_21 of a logic low status. As described above, when the programming operation begins, the latch enable signal NNERSL maintains a logic high status so that the NMOS transistors N21 and N22 are turned on. When the second enable signal EN_21 having the logic low status and the inverted signal of the second enable signal EN_21 are transferred, the NMOS transistor N24 and the PMOS transistor P21 are turned on so that the ground voltage is applied to the gates of the PMOS transistor P23 and the NMOS transistor N25, and the voltage VPPX is applied to the gates of the NMOS transistors N26 and N27. Thus, the NMOS transistors N26 and N27 and the PMOS transistor P23 are turned on so that the second voltage controller 870_11 may generate the second control signal CON_21 of a second voltage VPXCL [1] level and transfer the second control signal CON_21 of the second voltage VPXCL[1] level to the corresponding sense line SL[1].

That is, when the second enable signal EN_21 is in the logic low status, the second voltage controller 870_11 may generate the second control signal CON_21 of the second voltage VPXCL[1] level, and when the second enable signal EN_21 is in the logic high status, the second voltage controller 870_11 may generate the second control signal CON_21 of the third voltage VNX[1] level.

When the corresponding memory cell is selected in the erasure mode ERASE, the second enable signal EN_21 is in a logic high status. When the corresponding memory cell is not selected in the erasure mode ERASE, the second enable signal EN_21 is in a logic low status. Thus, when the corresponding memory cell is selected in the erasure mode ERASE, the second voltage controller 870_11 may generate the second control signal CON_21 of the third voltage VNX [1] level and output the second control signal CON_21 of the third voltage VNX[1] level to the corresponding sense line SL[1], and when the corresponding memory cell is not selected in the erasure mode ERASE, the second voltage controller 870_11 may generate the second control signal CON_21 of the second voltage VPXCL[1] level and output the second control signal CON_21 of the second voltage VPXCL[1] level to the corresponding sense line SL[1]. In the read mode READ, the second enable signal EN_21 is in the logic low status irrespective of whether the corresponding memory cell is selected, and thus the second voltage controller 870_11 may generate the second control signal CON_21 of the second voltage VPXCL[1] level and output the second control signal CON_21 of the second voltage VPXCL[1] level to the corresponding sense line SL[1].

The operations of the second voltage controllers 870_12, . . . , 870_1n are similar to that of the second voltage controller 870_11, and thus the descriptions of the other second voltage controllers are not repeated here.

Figure 11:
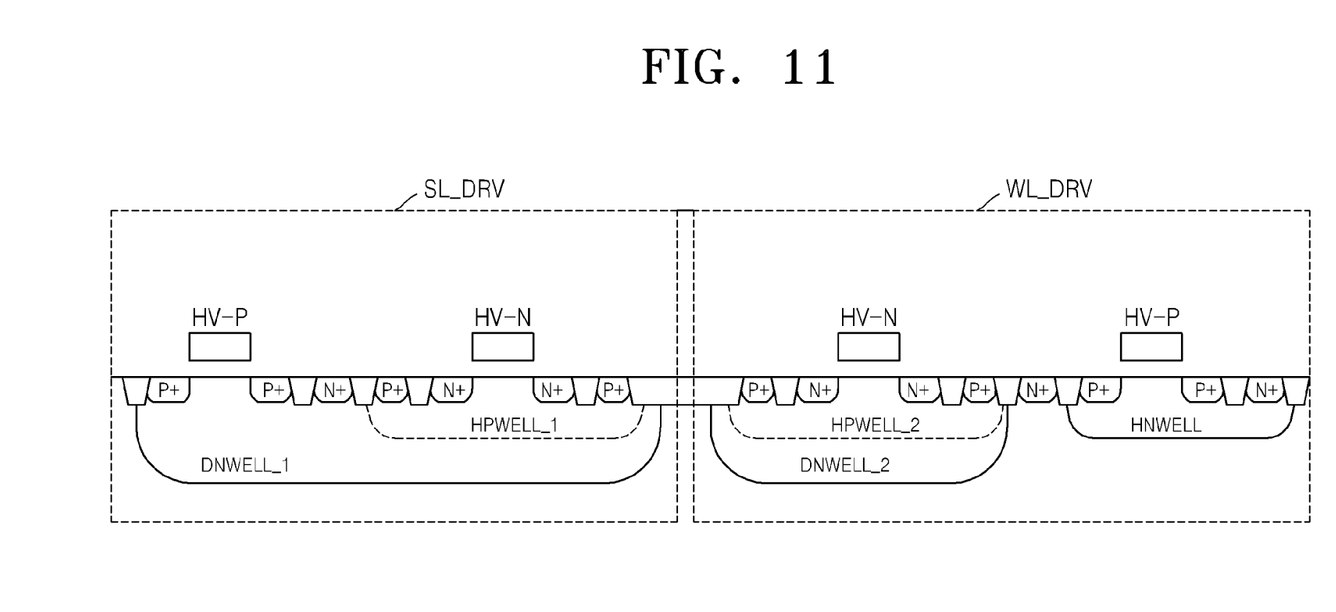
FIG. 11 is a cross-sectional view illustrating transistors of FIGS. 6 and 9 according to an example embodiment.

FIG. 11 is a cross-sectional view illustrating the transistors of FIGS. 6 and 9 according to an exemplary embodiment.

Referring to FIGS. 1 through 11, as described with reference to FIGS. 6 and 9, each of the word line driver WL_DRV and the sense line driver SL_DRV may include a plurality of PMOS transistors and a plurality of NMOS transistors. The PMOS transistor and the NMOS transistor included in the word line driver WL_DRV and the PMOS transistor and the NMOS transistor included in the sense line driver SL_DRV may be formed as shown in FIG. 11.

For example, the sense line driver SL_DRV may include the PMOS transistor formed on the first deep N-well DNWELL_1 and the NMOS transistor formed on the first high voltage P-well HPWELL_1 that is formed on the first deep N-well DNWELL_1. Although FIG. 11 shows a cross-sectional view of a single PMOS transistor and a single NMOS transistor included in the sense line driver SL_DRV, a plurality of PMOS transistors and a plurality of NMOS transistors may be formed by repeating the same method. In one embodiment, the PMOS transistor and NMOS transistor of the sense line driver SL_DRV are adjacent transistors. For example, in one embodiment, the PMOS transistor and NMOS transistor of the sense line driver SL_DRV are disposed without any other transistors between them.

The wordline driver WL_DRV may include the NMOS transistor formed on a second high voltage P-well HPWELL_2 that is formed on a second deep N-well DNWELL_2 different from the first deep N-well DNWELL_1, and the PMOS transistor formed on the high voltage N-well HNWELL neighboring the second deep N-well DNWELL_2. Although FIG. 11 shows a cross-sectional view of a single PMOS transistor and a single NMOS transistor included in the word line driver WL_DRV, a plurality of PMOS transistors and a plurality of NMOS transistors may be formed by repeating the same method. In one embodiment, the PMOS transistor and NMOS transistor of the word line driver WL_DRV are adjacent transistors. For example, in one embodiment, the PMOS transistor and NMOS transistor of the word line driver WL_DRV are disposed without any other transistors between them.

Additionally, in one embodiment, the NMOS transistor of the word line driver WL_DRV and the NMOS transistor of the sense line driver SL_DRV are adjacent transistors and are disposed between the PMOS transistor of the word line driver WL_DRV and PMOS transistor of the sense line driver SL_DRV.

Conventionally, the PMOS transistor of the word line driver WL_DRV is formed on one side of the sense line driver SL_DRV, and the NMOS transistor of the word line driver WL_DRV is formed on the other side of the sense line driver SL_DRV. Further, conventionally, a deep N-well in which the PMOS transistor and the NMOS transistor of the sense line driver SL_DRV are formed and a deep N-well in which the NMOS transistor of the word line driver WL_DRV is formed are the same. However, according to the example embodiments, while the PMOS transistor and the NMOS transistor of the word line driver WL_DRV are formed adjacent to each other and the PMOS transistor and the NMOS transistor of the sense line driver SL_DRV are formed adjacent to each other, a deep N-well in which the NMOS transistor of the word line driver WL_DRV are formed is different from a deep N-well in which the PMOS transistor and the NMOS transistor of the sense line driver SL_DRV are formed.

The foregoing is illustrative of example embodiments and is not to be construed as limiting thereof. The non-volatile memory device may include, for example, NAND flash, NOR flash, RRAM, MRAM, PRAM etc., and may be part of a semiconductor chip, a package including a semiconductor chip, a package-on-package device, a memory module, a cellular phone, a digital camera, an MP3 player, a solid state drive (SSD) etc. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A non-volatile memory device comprising:
   a memory cell array comprising a plurality of memory cells, each memory cell of the plurality of memory cells including a first cell transistor and a second cell transistor;
   a voltage generator for generating a plurality of voltages in response to an operation mode with respect to the plurality of memory cells; and
   a row decoder comprising a first driver and a second driver configured to generate a first control signal and a second control signal, respectively, wherein the first cell transistor is connected to the row decoder to receive the first control signal and the second cell transistor is connected to the row decoder to receive the second control signal,
   wherein the first driver includes a first NMOS transistor and a first PMOS transistor formed adjacent to the first NMOS transistor,
   wherein the second driver includes a second NMOS transistor and a second PMOS transistor formed adjacent to the second NMOS transistor, and
   wherein the first and second NMOS transistors are disposed between the first PMOS transistor and second PMOS transistor.

2. The non-volatile memory device of claim 1,
   wherein the first NMOS transistor is formed on a first N-well, and
   wherein the second NMOS transistor is formed on a second N-well different from the first N-well.

3. The non-volatile memory device of claim 2,
   wherein the first NMOS transistor is formed on a first P-well that is formed on the first N-well, and
   wherein the second NMOS transistor is formed on a second P-well that is formed on the second N-well.

4. The non-volatile memory device of claim 1, further comprising:
   a first local line for directly connecting a first output terminal of the voltage generator to a first input terminal of the first driver; and
   a second and third local line for directly connecting a second and third output terminal of the voltage generator to a second and third input terminal of the second driver, respectively.

5. The non-volatile memory device of claim 1, wherein the row decoder is formed on only one side of the memory cell array.

6. The non-volatile memory device of claim 1,
   wherein the first cell transistor includes a gate for receiving the first control signal,
   wherein the second cell transistor includes a gate for receiving the second control signal, and comprising a floating gate or a charge accumulation insulator between the gate and a bulk region, and
   wherein the first cell transistor and the second cell transistor are in series connected to each other between a corresponding bit line and common source line.

7. The non-volatile memory device of claim 6,
   wherein the first driver is configured to receive a first voltage among the plurality of voltages directly, and
   wherein the second driver is configured to receive a second voltage and a third voltage among the plurality of voltages directly.

8. The non-volatile memory device of claim 7, wherein the voltage generator is configured to generate the first voltage according to whether a corresponding memory cell is selected in a read mode in which a read operation is performed, and generate the second voltage and the third voltage according to whether the corresponding memory cell is selected in a program mode in which a program operation is performed or in an erasure mode in which an erasure operation is performed.

9. The non-volatile memory device of claim 7, wherein the first driver comprises:
a first selector for generating a first enable signal in response to a mode signal including information regarding the operation mode and a corresponding address;
a first level shifting circuit for performing a latch operation and a level shifting operation in response to the first enable signal; and
a first voltage controller for controlling a voltage of the first control signal by using an output signal of the first level shifting circuit and the first voltage,
wherein the second driver comprises:
a second selector for generating a second enable signal in response to the mode signal and the corresponding address;
a second level shifting circuit for performing the latch operation and the level shifting operation in response to the second enable signal; and
a second voltage controller for controlling a voltage of the second control signal by using an output signal of the second level shifting circuit, the second voltage, and the third voltage.

10. A row decoder comprising:
a first driver including a first input terminal configured to receive a first voltage, the first driver configured to generate a first control signal for controlling a first cell transistor of a memory cell; and
a second driver including a second input terminal and a third input terminal configured to receive a second voltage and a third voltage, respectively, the second driver configured to generate a second control signal for controlling a second cell transistor of the memory cell,
wherein the first driver comprises:
a first NMOS transistor formed on a first P-well that is formed on a first N-well; and
a first PMOS transistor formed on a second N-well disposed adjacent to the first N-well,
wherein the second driver comprises:
a second PMOS transistor formed on a third N-well separated from the first N-well; and
a second NMOS transistor formed on a second P-well that is formed on the third N-well.

11. The row decoder of claim 10, wherein the row decoder comprises at least one local line for directly connecting to the first input terminal of the first driver.

12. The row decoder of claim 10,
wherein the first driver is connected to a first local line to directly receive the first voltage, and
wherein the second driver is connected to a second and third local line to directly receive the second voltage and the third voltage, respectively.

13. The row decoder of claim 10, wherein the first voltage has a voltage level according to whether the memory cell is selected in a read mode in which a read operation is performed, and the second voltage and the third voltage have voltage levels according to whether the memory cell is selected in a program mode in which a program operation is performed or in an erasure mode in which an erasure operation is performed.

14. The row decoder of claim 12, wherein the first driver comprises:
a first selector for generating a first enable signal in response to a mode signal including information regarding the operation mode and a corresponding address;
a first level shifting circuit for performing a latch operation and a level shifting operation in response to the first enable signal; and
a first voltage controller for controlling a voltage of the at least one first control signal by using an output signal of the first level shifting circuit and the first voltage,
wherein the second driver comprises:
a second selector for generating a second enable signal in response to the mode signal and the corresponding address;
a second level shifting circuit for performing the latch operation and the level shifting operation in response to the second enable signal; and
a second voltage controller for controlling a voltage of the second control signal by using an output signal of the second level shifting circuit, the second voltage, and the third voltage.

15. A semiconductor memory device comprising:
a plurality of memory cells; and
a row decoder comprising a first driver and second driver;
wherein the first driver includes a first PMOS transistor and a first NMOS transistor disposed adjacent to the first PMOS transistor, the first NMOS transistor is formed on a first N-well,
wherein the second driver includes a second PMOS transistor and a second NMOS transistor disposed adjacent to the second PMOS transistor, the second NMOS transistor is formed on a second N-well different from the first N-well, and
wherein the first NMOS transistor and second NMOS transistor are adjacent transistor and are disposed between the first PMOS transistor and second PMOS transistor.

16. The semiconductor memory device of claim 15,
wherein the first NMOS transistor is formed on a first P-well that is formed on the first N-well, and
wherein the second NMOS transistor is formed on a second P-well that is formed on the second N-well.

17. The semiconductor memory device of claim 15,
wherein each cell of the plurality of memory cells comprises first and second cell transistors connected in series and including a first and second control gate, respectively,
wherein the first driver is configured to generate a first control signal for transmitting to the first control gate, and
wherein the second driver is configured to generate a second control signal for transmitting to the second control gate.

18. The semiconductor memory device of claim 15, further comprising:
a voltage generator for generating first, second, and third voltages in response to an operation mode,
wherein the first voltage is directly applied to a first input terminal of the first driver by using a first local line, and
wherein the second and third voltages are directly applied to a second input terminal and third input terminal of the second driver by using a second and third local line, respectively.

19. The semiconductor memory device of claim 18, wherein the first voltage has a voltage level according to whether the corresponding memory cell of the plurality of memory cells is selected in a read mode in which a read operation is performed, and the second voltage and the third voltage have voltage levels according to whether the corresponding memory cell of the plurality of memory cells is selected in a program mode in which a program operation is performed or in an erasure mode in which an erasure operation is performed.

* * * * *